United States Patent [19]

Bollweber et al.

[11] Patent Number: 4,891,973
[45] Date of Patent: Jan. 9, 1990

[54] CIRCUIT ARRANGEMENT FOR TRANSMITTING MEASUREMENT VALUES ON VEHICLE WHEELS

[75] Inventors: Lothar Bollweber, Steinmauern; Walter Jansche, Durmersheim; Robert Hugel, Karlsruhe; Claus-Dietrich Pilch, Remchingen; Manfred Rothley, Kraichtal; Erich Zabler, Stutensee, all of Fed. Rep. of Germany

[73] Assignee: Robert Bosch GmbH, Stuttgart, Fed. Rep. of Germany

[21] Appl. No.: 221,464

[22] PCT Filed: Dec. 24, 1986

[86] PCT No.: PCT/DE86/00523

§ 371 Date: Jun. 9, 1988

§ 102(e) Date: Jun. 9, 1988

[87] PCT Pub. No.: WO87/04123

PCT Pub. Date: Jul. 16, 1987

[30] Foreign Application Priority Data

Jan. 8, 1986 [DE] Fed. Rep. of Germany ....... 3600260

[51] Int. Cl.[4] .................. B60C 23/04; H03K 6/02; H05F 3/00; G08C 15/12
[52] U.S. Cl. .................. 73/146.5; 340/448; 374/143
[58] Field of Search ................ 73/146.2, 146.3, 146.4, 73/146.5, 146.8; 374/143; 340/448

[56] References Cited

U.S. PATENT DOCUMENTS

| 4,467,641 | 8/1984 | Abraham | 73/146.5 |
| 4,567,459 | 1/1986 | Folger et al. | 73/146.5 |
| 4,749,993 | 6/1988 | Szabo et al. | 73/146.5 |

*Primary Examiner*—Donald O. Woodiel
*Attorney, Agent, or Firm*—Michael J. Striker

[57] ABSTRACT

A circuit arrangement for transmitting variable measurement values, such as pressure and temperature, at vehicle wheels is provided which transmits the measurement values in the form of H-F signals to a stationary evaluating circuit (12) with great accuracy, high reliability and in short time intervals. A repeater coil (b 13), which is connected with the latter, arranged in the vicinity of the wheel so as to be stationary and connected to voltage by a square-wave generator (15), cooperates with a revolving repeated coil (19) which is fastened at the vehicle wheel and connected with a sensor circuit arrangement (20) supplied by it. The sensor circuit arrangement (20) contains a timing element (29) which responds to a voltage peak in the revolving repeater coil (19 l) at the end of a voltage pulse of the square-wave generator (15) and, with a corresponding delay, triggers a timing circuit (30) for transmitting the measurement values, which timing circuit (30) is connected with it on the output side, wherein the delay time of the timing element (29), together with the duty cycle of the timing circuit (30), is shorter than the pause time of the square-wave voltage at the square-wave generator (15).

10 Claims, 2 Drawing Sheets

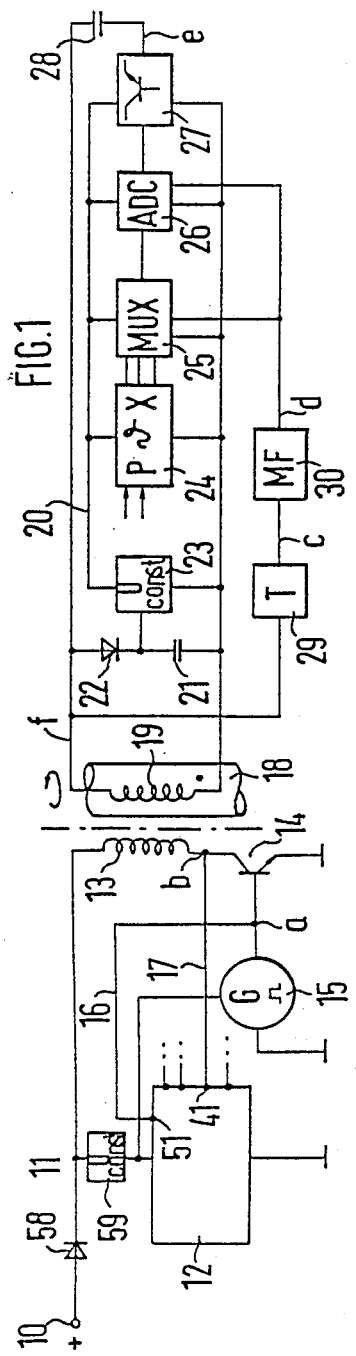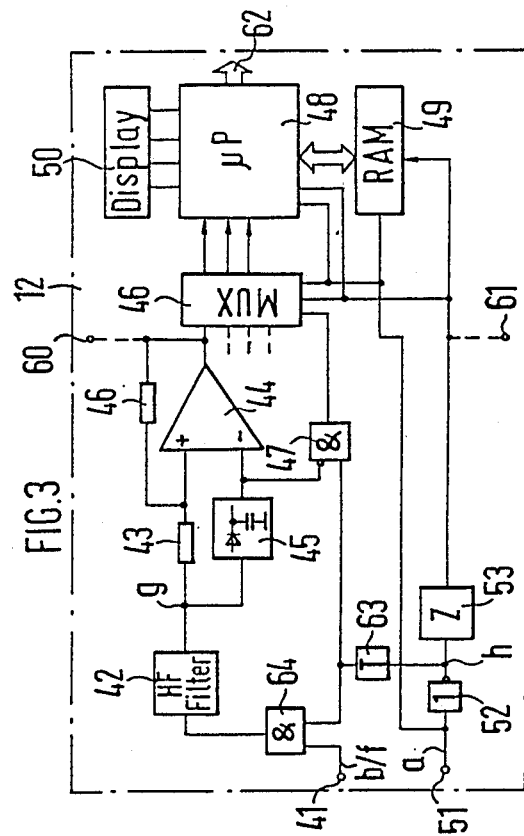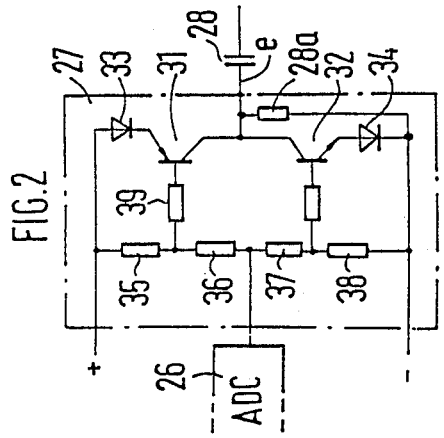

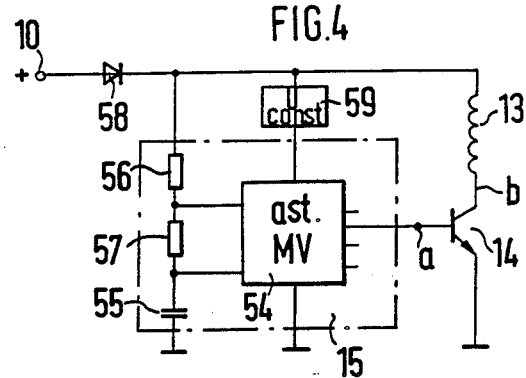
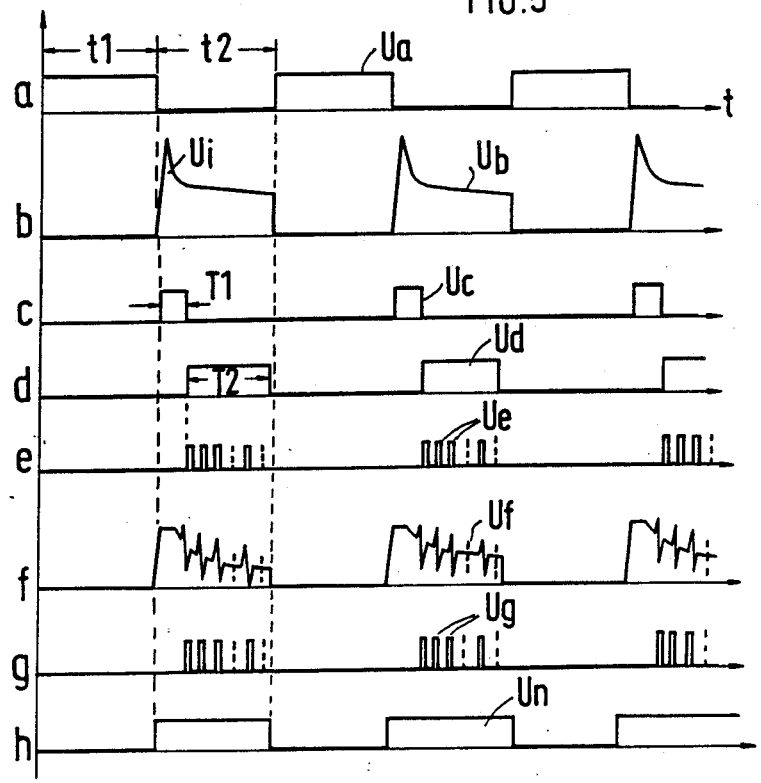

CIRCUIT ARRANGEMENT FOR TRANSMITTING MEASUREMENT VALUES ON VEHICLE WHEELS

PRIOR ART

The invention is based on a circuit arrangement for transmitting variable measurement values such as pressure and temperature on vehicle wheels according to the preamble of the main claim. Such a circuit arrangement is already known from DE-PS No. 30 29 563, in which energy is transmitted to a revolving repeater coil by a low-frequency chopper via a stationary repeater coil, a sensor circuit being connected to the revolving repeater coil. The measurement values of the sensors at the vehicle wheel are converted by means of a converter into signals having an analog frequency which amount to a multiple of the chopper frequency and reach the stationary evaluating circuit from the repeater coils via a high-pass filter. As long as a threshold value switch in the sensor circuit arrangement activates the measurement value converter, the stationary evaluating circuit interrupts the chopper. Accordingly, during the retransmission of the information signal via the converter coils, no energy is transmitted into the sensor circuit arrangement and, accordingly, the information signals arriving via the same channel are separated from the energy transmission.

A disadvantage in this known solution is that the measured values of the tire pressure and the tire temperature are not transmitted to the evaluating circuit separately from one another, but, rather, they are tied to one another already in the sensor circuit in such a way that a so-called temperature compensated tire pressure results as measurement value. Further, it is also disadvantageous that the frequency range for the signal transmission is relatively large if a fine grading of the measurement values to be transmitted is desirable. Moreover, the time for the measurement value transmission in the known solution is dependent upon the loading of a storage capacitor which was previously loaded by means of the switched on chopper. The transmission of the measurement values is accordingly delayed in an undesirable manner.

In the present solution, it is attempted to transmit the measurement values to the evaluating circuit quickly in the form of a pulse train in firmly predetermined time intervals in the operating pauses of a stationary square-wave generator for the energy supply of the sensor circuit arrangement in order to achieve in this manner a high information resolution and, consequently, a fine grading of the measurement values to be transmitted.

ADVANTAGES OF THE INVENTION

The circuit arrangement, according to the invention, with the characterizing features of the main claim has the advantage that measurement values at vehicle wheels can reach the evaluating circuit with high resolution as a digital pulse train with the low-frequency clock of the stationary square-wave generator for the energy supply of the sensor circuit arrangement, wherein the transmission time is fixed for every measurement value. Another advantage can be seen in that the voltage peak induced in the repeater coils when switching off the supply voltage in the clock of the square-wave generator does not fall in the time interval for the signal transmission and, accordingly, cannot effect a falsification of the measurement values to be transmitted. Moreover, these voltage peaks are used in an advantageous manner for triggering the transmission of the measurement values with a predetermined time delay and ensuring them over a predetermined time. Since the measurement values or measurement value changes are conveyed from the vehicle wheels in this manner in a rapid sequence, it is also possible to use them for regulating the tire pressure.

Advantageous developments and improvements of the characteristic features indicated in the main claim are made possible by means of the steps indicated in the subclaims. It is particularly advantageous that the timing circuit for transmitting measurement values, which is triggered by the timing element of the sensor circuit arrangement, which timing element responds to the voltage pulses, be a monostable multivibrator, wherein a coupling stage for transmitting the H-F signals to the revolving repeater coil is switched on via the output of the monostable multivibrator, the coupling stage being arranged downstream of the measurement value converter. The coupling circuit is comprised in an advantageous manner of two transistor switches which are in series and are connected to the supply voltage of the sensor circuit and controlled by the output of the measurement value converter in push-pull operation, their connection being coupled with the revolving repeater coil via a capacitor. A particularly high resolution of the measurement values is ensured in that the measurement value converter is an analog-digital encoder which gives the measurement values of at least one sensor to the coupling circuit as a serial bit sequence in dual code, and a corresponding decoder in the evaluating circuit is assigned to it.

DRAWING

An embodiment example of the invention is shown in the drawing and explained in more detail in the following description.

FIG. 1 shows a block wiring diagram of the circuit arrangement, according to the invention, for the transmission of measurement values at vehicle wheels, FIG. 2 shows the circuit construction of a coupling stage in the sensor circuit arrangement, FIG. 3 shows a wiring diagram of the stationary evaluating circuit, FIG. 4 shows a wiring diagram of the square-wave generator, and FIG. 5 shows the voltage or signal configurations at various points of the circuit arrangement according to the invention.

DESCRIPTION OF THE EMBODIMENT EXAMPLE

FIG. 1 shows the circuit arrangement, according to the invention, for monitoring variable measurement values such as pressure and temperature at a wheel of a motor vehicle as a block wiring diagram. It comprises a stationary circuit part at the vehicle which is to be connected to the battery voltage of the vehicle by a plus pole 10. The voltage is connected to an evaluating circuit 12, explained in more detail in FIG. 3, across a reverse battery protection diode 58, a supply line 11 and a voltage regulator 59 and to one end of a repeater coil 13 arranged in the vicinity of the wheel so as to be stationary. The other end of the repeater coil 13 is grounded via an n-p-n conducting switching transistor 14. However, the switching transistor 14 can also be arranged prior to the repeater coil 13 so as to be p-n-p conducting. The emitter of the switching transistor 14 is at the output of a square-wave generator 15 which is shown in more detail in FIG. 4. The evaluating circuit 12 is connected with the output of the square-wave generator 15 via a line 16 and with the connection between the repeater coil 13 and switching transistor 14 by a line 17.

The vehicle wheel is shown symbolically by way of a shaft 18 on which is arranged a repeater coil 19 which revolves with the wheel. The stationary repeater coil 13 and the revolving repeater coil 19 can be arranged concentrically one above the other or axially next to one another in the bearing area of the vehicle wheel, so that a transmission of measurement values is also possible when the wheel is stationary. But a measurement value transmission which is independent of the wheel rotation is also possible if the revolving repeater coil 19 is fastened at the circumference of the wheel rim as a toroidal coil and the stationary repeater coil 13 fits in its circumferential area at the vehicle body, preferably at the caliper. The revolving repeater coil 19 is connected by its ends to a sensor circuit arrangement 20 which is either fastened jointly with the sensors in the drop base of the wheel rim or is arranged externally at the wheel rim separately from the sensors. For the energy supply, the sensor circuit arrangement 20 has a storage capacitor 21 which lies parallel to the repeater coil 19 across a diode 22, which is connected upstream, and is charged to approximately 22 V by the positive half-waves in the repeater coil 19 with the clock of the square-wave generator 15. In order to smooth the supply voltage, the storage capacitor 21 is connected to a voltage regulator 23 which supplies a plurality of semiconductor sensors 24 and additional circuit components with its stabilized output of 15 V. In the example, a tire pressure sensor P and a temperature sensor $\theta$ are provided as semiconductor sensors. Additional sensors X can also be provided in this case, if necessary, for other measurement variables or for a two-fold measurement of pressure and temperature. The measurement signals of the semiconductor sensors 24 are guided parallel to a multiplexer 25 whose output is connected with an analog-digital encoder 26 as measurement value converter. The output of the measurement value converter 26 is connected with a coupler or driver stage 27, which is shown in detail in FIG. 2. The signal output of the driver stage 27 is connected with the repeater coil 19 via a capacitor 28. Moreover, the repeater coil 19 is connected to a timing element 29 which is connected on the output side with a timing circuit 30. The timing circuit 30 is constructed in the example as a monostable multivibrator whose output triggers the measurement value converter 26, the monostable multivibrator being connected to the control input of the multiplexer 25 in addition.

FIG. 2 shows the construction of the driver stage 27 which substantially comprises two switching transistors 31 and 32 which are in series and connected to the output voltage of the voltage regulator 23. A p-n-p switching transistor 31 is connected with the positive potential of the supply voltage by a diode 33 connected upstream, whereas a n-p-n switching transistor 32, in series with the p-n-p switching transistor 31, is connected to negative potential via a diode 34, which is connected downstream. A resistance branch, which is likewise connected with the supply voltage and consists of four resistors 35, 36, 37 and 38 in series, serves as a voltage divider, wherein the base of the p-n-p switching transistor 31 is connected between the two first resistors 35 and 36 via a base resistor 39. The base of the n-p-n transistor 32 is connected to the connection of the two other resistors 37 and 38 via a base resistor 40. The central tapping between the resistors 36 and 37 is at the output of the measurement value converter 26, the switching transistors 31 and 32 are controlled on and off in push-pull operation by means of the output signals of the measurement value converter 26. The connection between the two switching transistors 31 and 32 is connected to the capacitor 28 for the signal coupling of the repeater coil 19 and is connected to negative potential via a discharging resistor 28a.

FIG. 3 shows the evaluating circuit 12 from FIG. 1 in a schematic manner. For each vehicle wheel, a signal input 41, which is connected with the stationary repeater coil 13, is connected with the positive input of a Schmitt trigger 44 via an AND gate 64, a H-F filter 42 and a resistor 43, the negative input of the Schmitt trigger 44 being connected to the output of the H-F filter 42 via a rectifier smoothing stage 45. The output of the Schmitt trigger 44 is coupled back on the one hand with the positive input via a resistor 46 and is connected on the other hand to an input of another multiplexer 46. For the purpose of the synchronization with the multiplexer 25 of the sensor circuit arrangement 20, a resetting input of the multiplexer 46 is connected to the output of an AND gate 47 which is connected by its first input to a clock input 53 via a delay stage 63 and an inverter 52 and is connected by its other, negated input to the negative input of the Schmitt trigger 44. A microprocessor 48, which is connected with a measurement value storage 49, is connected downstream of the multiplexer 46 for the decoding and further processing of the transmitted measurement value signals. Moreover, a display 50, on which an indicator appears when critical values occur, is connected to the microprocessor 48. If needed, the measured values can also be called and displayed via push buttons to be connected to the microprocessor 48. Moreover, the output signals of the square-wave generator 15 are fed to a clock input of the multiplexer 46, the microprocessor 48 and the measurement value storage 49 via the clock input 51 of the evaluating circuit. In addition, a counter 53 is accordingly controlled via the inverter 52, the output of the counter 53 controls the multiplexer 46, the microprocessor 48 and the data input and output of the measurement value storage 49. The delay stage 63 connected to the output of the inverter 52 is also connected to the second input of the AND gate 64 which is connected upstream of the H-F filter 42.

FIG. 4 shows the schematic construction of the square-wave generator 15 from FIG. 1 for controlling the switching transistor 14 in the circuit of the repeater coil 13. The square-wave generator 14 contains an astable multivibrator 54 for supplying energy to the sensor circuit arrangement 20 in a uniform manner independently of fluctuations of the supply voltage; the timing element of the astable multivibrator 54 is formed by a capacitor 55 and the resistors 56 and 57 connected downstream, the timing element being connected to the unregulated supply voltage at the terminal 10 via the diode 58 as reverse battery protection. In addition, the stationary repeater coil 13 and the input of the voltage regulator 59 are connected to terminal 10 via the diode 58, the output of the voltage regulator 59 supplies the circuits 12 (FIG. 3) and 15 with constant voltage.

The operation of the circuit arrangement, according to the invention, is explained in more detail in the following by means of the voltage and signal configurations at various points of the circuit arrangement as shown in FIG. 5. At point a at the output of the square-wave generator 15, square-wave signals Ua, with a frequency of approximately 150 Hz, are transmitted by the astable multivibrator 54 to the control input of the switching transistor 14 and to the terminal 51 of the evaluating circuit 12; in so doing, the pulse time t1=4 ms and the pause time t2≈3 ms. During the pulse time t1, the switching transistor 14 is controlled so as to conduct, and a current, which forms a magnetic field which is coupled with the revolving repeater coil 19, flows through the repeater coil 13. When the pause time t2 commences, the transistor 14 is blocked; the current in the stationary repeater coil 13 is interrupted and, consequently, an induction voltage Ub, which has the configuration shown in FIG. 5 at point b of the circuit between the switching transistor 14 and the repeater coil 13, is produced in both repeater coils 13 and 14. In so doing, a voltage peak Ui first occurs, followed by a falling voltage ridge. The pick-up voltage of the timing element 29 in the sensor circuit arrangement 20 is adjusted in such a way that it puts out a voltage pulse Uc with the duration T1 of 0.5 ms by means of this voltage peak Ui at the output of the timing element 29 at point c of the circuit, which voltage pulse Uc blocks the timing circuit 30 which is connected downstream. After the delay time T1 expires, the timing circuit 30 is released and a control pulse Ud appears, according to FIG. 5, at point d at the output of the timing circuit 30, which control pulse Ud reaches both the multiplexer 25 and the control input of the measurement value converter 26 and, accordingly, releases the sensor circuit arrangement 20 for the transmission of measurement values. The duty cycle T2 of the timing circuit 30 and, accordingly, the duration of the control pulse Ud for the measurement value transmission, is 2 ms. A measurement value transmission which is complete and uninfluenced by the voltage peak Ui is ensured in that the delay time T1 of the timing element 29, together with the duty cycle T2 of the timing circuit 30, is shorter than the pause time t2 of the signals Ua of the square-wave generator 14.

The multiplexer 25 switches the measurement values at a vehicle tire, which are detected by the semiconductor sensors 24, to the measurement value converter 26 in a cyclical manner in the form of analog voltage values. The multiplexer 25 is connected to the output of the timing circuit 30 by its clock input and switches the next sensor or a released input, respectively, over to its output in a cyclical manner with the trailing edge of the pulses Ud, i.e. after the duty cycle T2 is terminated. The measurement value of the semiconductor sensor 24, which is switched through by the multiplexer 25, consequently arrives at the measurement value converter 26 until the end of the duty cycle T2. The measurement value converter 26 is now released for the duty cycle T2 by means of the control pulse Ud of the timing circuit 30, and the measurement value is transmitted in a known manner, e.g. as a serial 8-bit sequence in dual code, to the input of the coupling stage 27, by means of which the switching transistors 31 and 32 are alternately switched on and off. A corresponding serial bit sequence of voltage pulses Ue, which are shown in FIG. 5, occurs at point e at the output of the coupling stage 27, wherein blank spaces (logical zeros) are marked in a dashed line, and these voltage pulses Ue reach the repeater coil 19 via the capacitor 28 as spike pulses with a frequency of 20 KHz in the example. At each voltage pulse Ue, a positive and a negative spike pulse is produced by means of the filter capacitor 28. However, since the positive spike pulses are limited by the storage capacitor 21, as is the voltage peak Ui in the repeater coil 19, only the negative spike pulses have importance for the evaluation. The spike pulses are superimposed at the repeater coil 19 with the induced voltage Ub for the energy transmission to form the voltage configuration Ue, shown in FIG. 5, at point f of the circuit at the input of the revolving repeater coil 19. A corresponding voltage curve also results at the stationary repeater coil 13 at point b of the circuit, which reaches the signal input 41 of the evaluating circuit 12 via the line 17 (FIG. 3).

The spike pulses Ug are filtered again at point g of the circuit as serial 8 bit sequence by means of the H-F filter 42 and are transmitted to the positive input of the Schmitt trigger 44 via the resistor 43, wherein the switch-off voltage peak Ui is blanked at the repeater coil 19 at point h of the circuit by means of the AND gate 64, which is connected upstream, with the square-wave signal Uh, which is delayed by approximately 0.4 ms by the delay stage 63 and inverted by means of the inverter 52. The reference voltage is fed to the negative input of the Schmitt trigger via the rectifier smoothing stage 45 as a function of the amplitude of the spike pulses, so that, at the output of the Schmitt trigger 44, digital signals reach the microprocessor 48 via the multiplexer 46 as a serial bit sequence in dual code independently of the amplitude of the spike pulses. In a decoding circuit realized by means of the microprocessor 48, the serial bit sequence is decoded, filed in an area of the measurement value storage 49 and utilized for further signal processing. The microprocessor 48 indicates the determined measurement value on the display 50 when a critical limit is reached.

Since the multiplexer 25 in the sensor circuit arrangement 20 is switched forward to the next sensor or to a blank position in a cyclical manner after every control pulse Ud of the timing circuit 30, th multiplexer 46 in the stationary evaluating circuit 12 must accordingly work in a synchronous manner. For this purpose, the multiplexer 46 is connected by it control input to the clock input 51 of the evaluating circuit 12 at which the signals Ua of the square-wave generator 15 arrive via the line 16. With every leading edge of the signal, the multiplexer 46, working as a demultiplexer, is cyclically switched over to its next output or to a blank position. The synchronization of the multiplexer 46 of the evaluating circuit 12 with the multiplexer 25 of the sensor circuit arrangement 20 is effected by means of the blank position at the multiplexer 25 of the sensor circuit arrangement 20. It is occupied between every two cyclical switching passes of the multiplexer 25 in the sensor circuit arrangement 20. Consequently, in the blank position of the multiplexer 25, no pulse train is transmitted in the pause time t2 of the square-wave generator 15 via the measurement value converter 26 or the coupling stage 27 connected downstream. The blank position of the multiplexer 25 of the sensor circuit arrangement 20 is now detected in the evaluating circuit 12 with the AND gate 47, since, in this case, one input of the gate 47, which input is connected with the clock input 51, is at 1 because of the output signals Ua of the square-wave generator 15 via the inverter 52 and the delay stage 63, and the negating input of the gate 47 is at 0 because of the absent measurement pulses Ug at the output of the rectifier smoothing stage 45. The output of the gate 47 is connected with the resetting input of the multiplexer 46, so that when no measurement value transmission occurs in the pause time t2 of the square-wave generator 15, the multiplexer 46 is reset in the evaluating circuit 12 by means of the AND gate 47 and synchronized with the multiplexer 25 of the sensor circuit arrangement 20.

The analog measurement values of the sensors 24 in the sensor circuit arrangement 20 are resolved, transmitted and evaluated in a more or less fine grading by means of the digitalization at the measurement value converter 26. Slight fluctuations of the measurement values can occur because of measurement value tolerances, mechanical oscillations at the vehicle tire or other deficiencies. In order to compensate for such fluctuations and, accordingly, to simultaneously improve the measuring accuracy, the measurement values reaching the evaluating circuit are summed as a serial bit sequence in the measurement value storage 49 over a determined number of cycles of the square-wave generator 15 (FIG. 3) and a mean value is formed from this in the microprocessor 48 and possibly displayed on the display 50. For this purpose, the counter 53 is provided for adjusting the number of cycles, which counter 53 is connected with the square-wave signals Ua of the square-wave generator 15 by its input via the inverter 52 at the clock input 51 and can be adjusted to a determined number of cycles, for example, to the number 15, by means of switches, not shown. The measurement value storage 49 is controlled via the output of the counter 52 in such a way that it is opened for 15 cycles of the square-wave generator 15 for the purpose of reading in measurement values so as to deliver the latter to the microprocessor 46 subsequently for further processing. Since, in this example, tire pressure and tire temperature are transmitted in a cyclical manner independently of one another and are read into correspondingly assigned areas of the storage 49, five tire pressure measurements and 5 temperature measurements are used for forming a mean value for 15 cycles of the counter 53, while the synchronization of the multiplexers 25 and 46 is effected in the remaining five cycles of the square-wave generator 15. The measurement data gathered in the measurement value storage 49 are advisably delivered to the microprocessor 48 in a blank position of the multiplexer.

An evaluation of the clock and measurement value pulses which is decoupled from electromagnetic disturbances may also be possible by means of adding optocouplers in the evaluating circuit. Two connections 60, 61 are shown in a dashed line in FIG. 3 for the connection of such optocouplers. The control signal at the output of the counter 53 for controlling external measurement value storages can be tapped at the connection 61, while the serial measurement value pulses in the pause times t2 of the control pulses Ua of the square-wave generator 15 can be tapped at the connection 60.

The invention is not limited to the embodiment example which is shown, since the measurement value to be transmitted can be realized in various forms and sequences of H-F signals in the voltage pauses of the square-wave generator. Likewise, the form of the signal evaluation is not limited to the embodiment example. However, it is substantial to the invention that the sensor circuit arrangement 20 contain a timing element 29 which responds to a voltage peak Ui in the revolving repeater coil 19 which is produced by means of the end of a square-wave signal Ua of the square-wave generator 15, and that the timing element 29 trigger a timing circuit 30 for transmitting measurement values with a corresponding delay time T1, the timing circuit 30 being connected to it at the output side, wherein the delay time T1 of the timing element 29, together with the duty cycle T2 of the timing circuit 30, must be shorter than the pause time t2 of the signals Ua at the square-wave generator 15. Thus, it is also possible within the framework of the invention to use a measurement value converter 26 in the sensor circuit arrangement 20, which measurement value converter 26 delivers a quantity of voltage pulses Ue which increases in proportion to the voltage put out by the sensors 24 with a constant frequency during the duty cycle T2 of the timing circuit 30, this quantity being summed in the evaluating circuit 12 for a determined number of measurement cycles for determining the measurement value. Moreover, a frequency converter, which works proportionally to the voltage of the sensors 24, can be used as a measurement value converter 26, so that the frequency-dependent quantity of spike pulses Ug which are transmitted during the duty cycle T2 of the timing circuit 30 in the pause time of the square-wave generator 15 is a measurement for the tire pressure or for the tire temperature, e.g. one pulse per 0.1 bar or 1° C. The measuring accuracy can also be increased in this case in that the measurement pulses to be transmitted are summed in the measurement value storage 49 over two or more cycles of the square-wave generator 15.

In FIG. 3, the evaluating circuit 12 is shown and explained only for one vehicle wheel. Since the air pressure and temperature of the rest of the vehicle wheels are determined in the same manner, the multiplexer 46 is provided with a corresponding quantity of inputs, indicated in dashed lines, for additional Schmitt triggers 44, the multiplexer 46 being switched over between these inputs after every 15 cycles of the square-wave generator 15 via a control input connected with the output of the counter 53. Moreover, further processing of the determined measurement values can be carried out with the microprocessor 48 in such a way that a device for regulating the air pressure in the individual vehicle tires is controlled via another output 62. Since the various measurement values of all the vehicle wheels to be monitored must be available in this case in the quickest possible sequence, the transmission of the measurement values as serial bit sequence in dual code provides the possibility of reliably transmitting every measurement value with high accuracy by means of a correspondingly high digital resolution of the analog measurement value during one cycle of the square-wave generator 15. Moreover, determined bits, for example, the first or the last two bits of a signal sequence, can be used for identifying the transmitted measurement value, so that it is not necessary to switch over the measurement value to the multiplexer 46 of the evaluating circuit 12. Since the microprocessor 48 can identify and correspondingly process the transmitted measurement value by means of the identification, the multiplexer 46 is only needed for cyclically switching over the evaluating circuit to the various vehicle wheels. It is likewise possible, within the framework of the invention, to arrange the multiplexer 46, or a demultiplexer, prior to the H-F filter 42 so as to be able to use only one Schmitt trigger 44 for transmitting the tire pressure or the tire temperature of all the vehicle wheels.

We claim:

1. Circuit arrangement for transmitting variable measurement values, such as pressure and temperature, at vehicle wheels, comprising a repeater coil which is arranged at the vehicle in the vicinity of the wheel so as to be stationary and which is connected, on the one hand, to a square-wave generator (15) for supplying energy to a sensor circuit arrangement which revolves with the vehicle wheel and, on the other hand, to an evaluating circuit for transmitting measurement values in the voltage pauses of the square-wave generator (15), and comprising a revolving repeater coil which is fastened at the vehicle wheel, cooperates with the stationary repeater coil and is connected with the sensor circuit arrangement at the vehicle wheel for supplying energy on the one hand and for transmitting the measurement values on the other hand; the sensor circuit arrangement comprises a measurement value converter which transmits the measurement values produced by at least one sensor to the repeater coil in the form of H-F signals in the voltage pauses of the square-wave generator and whose frequency is a multiple of the frequency of the square-wave generator, characterized in that the sensor circuit arrangement (20) also contains a timing element (29) which responds to a voltage peak (Ui) in the revolving repeater coil (19) produced by means of the end of a voltage pulse (Ua) at the square-wave generator (15) and which triggers a timing circuit (30) with a corresponding delay time (T1) for transmitting the measurement values, which timing circuit (30) is connected with it on the output side, wherein the delay time (T1) of the timing element (29), together with the duty cycle (T2) of the timing circuit (30), is shorter than the pause time (t2) of the square-wave voltage at the square-wave generator (15).

2. Circuit arrangement according to claim 1, characterized in that the timing circuit (30) triggered by the timing element (29) is a monostable multivibrator, the measurement value converter (26) and a driver stage (27) connected downstream of the latter being switched on via the output of the monostable multivibrator for transmitting the H-F signals to the revolving repeater coil (19).

3. Circuit arrangement according to claim 2, characterized in that the driver stage (27) comprises two transistor switches (31, 32) which are in series, connected to the supply voltage of the sensor circuit arrangement (20) and are controlled by the output of the measurement value converter (26) in push-pull operation, and whose connection is coupled with the revolving repeater coil (19) via a capacitor (28).

4. Circuit arrangement according to claim 2 or 3, characterized in that the measurement value converter (26) is an analog-digital encoder (ADC) which delivers the measurement values of at least one sensor (24) to the driver stage (27) as a serial bit sequence in dual code and to which is assigned a corresponding decoder (48) in the evaluating circuit (12).

5. Circuit arrangement according to one of claims 1–3 characterized in that the measurement values arriving in the evaluating circuit from the stationary repeater coil (13) as H-F signals via a filter element (42) are summed over a determined number of cycles of the square-wave generator (15) in a measurement value storage (49) and a mean value derived from this is displayed.

6. Circuit arrangement according to claim 5, characterized in that the evaluating circuit (12) contains a Schmitt trigger (44) for each vehicle wheel, whose positive input is connected with the output of the filter element (42) via a resistor (43) and whose negative input is connected with the output of the filter element (42) via a rectifier smoothing stage (45).

7. Circuit arrangement according to claim 5, characterized in that the measurement value storage (49) is controlled by a counter (53) which is connected by its input with the output of the square-wave generator (15).

8. Circuit arrangement according to claim 7, characterized in that the square-wave generator (15) contains an astable multivibrator (54) for the continuous energy supply of the sensor circuit arrangement (20), the timing element (55, 57) of the astable multivibrator (54) being connected to the unregulated supply voltage of the stationary repeater coil (13), so that the clock frequency of the multivibrator (54) changes as a function of the voltage change of the supply voltage of the timing element.

9. Circuit arrangement according to claim 1, characterized in that a multiplexer (25), which is arranged in the sensor circuit arrangement (20) between a plurality of sensors (24) and the measurement value converter (26), is connected to the output of the timing circuit (30) by its clock input for the cyclical transmission of a plurality of measurement values at a vehicle tire.

10. Circuit arrangement according to claim 9, characterized in that the multiplexer (25) in the sensor circuit arrangement (20) occupies a blank position between two cyclical switch-over passes in which no transmission of measurement values occurs, and in that a multiplexer (46), which is arranged in the evaluating circuit (12), is reset for synchronization by means of this blank position.

* * * * *